United States Patent [19]
Owada et al.

[11] Patent Number: 5,220,199
[45] Date of Patent: * Jun. 15, 1993

[54] SEMICONDUCTOR INTEGRATED CIRCUIT DEVICE IN WHICH A SEMICONDUCTOR CHIP IS MOUNTED WITH SOLDER BUMPS FOR MOUNTING TO A WIRING SUBSTRATE

[75] Inventors: Nobuo Owada; Kaoru Oogaya, both of Ohme; Tohru Kobayashi, Iruma; Mikinori Kawaji, Hino, all of Japan

[73] Assignee: Hitachi, Ltd., Tokyo, Japan

[*] Notice: The portion of the term of this patent subsequent to Jun. 25, 2008 has been disclaimed.

[21] Appl. No.: 714,627

[22] Filed: Jun. 13, 1991

Related U.S. Application Data

[62] Division of Ser. No. 406,548, Sep. 13, 1989, Pat. No. 5,027,188.

[30] Foreign Application Priority Data

Sep. 13, 1988 [JP] Japan ................ 63-229221

[51] Int. Cl.$^5$ ............................................. H01L 23/48
[52] U.S. Cl. .................... 257/773; 257/737; 257/741; 257/758; 257/786
[58] Field of Search ............. 357/68, 71, 67, 65; 257/773, 737, 741, 758, 786

[56] References Cited

U.S. PATENT DOCUMENTS

| | | | |
|---|---|---|---|
| 4,316,208 | 2/1982 | Kobayashi et al. | 357/55 |
| 5,027,188 | 6/1991 | Owada et al. | 357/68 |

FOREIGN PATENT DOCUMENTS

60-119749  6/1985  Japan.

OTHER PUBLICATIONS

Miller, L. F., "Controlled Collapse Reflow Chip Joining", IBM J. Res. Develop, May, 1969, pp. 239-250.

*Primary Examiner*—Mark V. Prenty
*Attorney, Agent, or Firm*—Antonelli, Terry, Stout & Kraus

[57] ABSTRACT

A multi-layered structure of wirings on a semiconductor substrate has been employed in conjunction with the increase in the integration density of semiconductor integrated circuit devices. In the invention, dummy patterns made of the same material as an Al wiring layer for compensating for any step or level gradation are disposed in the regions below bump electrodes and in the proximity thereof in order to reduce any defects inherent to a multi-layered structure that occur in CCB bump electrodes formed on the multi-layered wirings and at pads as the base layer of the former.

34 Claims, 7 Drawing Sheets

SEMICONDUCTOR INTEGRATED CIRCUIT DEVICE IN WHICH A SEMICONDUCTOR CHIP IS MOUNTED WITH SOLDER BUMPS FOR MOUNTING TO A WIRING SUBSTRATE

This is a continuation of application Ser. No. 07/406,548, filed Sep. 13, 1989 and now U.S. Pat. No. 5,027,188.

BACKGROUND OF THE INVENTION

This invention relates to a semiconductor integrated circuit device and, more particularly, to a technique which will be useful when applied to a semiconductor integrated circuit device of a flip-chip system in which a semiconductor chip is mounted to a substrate through solder bumps.

A multi-layered structure of wirings for improving freedom of wiring design and for reducing wiring delay, i.e. reducing propagation time delay attributable to the length of wiring, has become essential to the technique employed with respect to the achievement of a higher integration density of semiconductor integrated circuit devices For instance, an Al (aluminum) four-layered wiring structure has thus far been accomplished in logic LSIs consisting of bipolar transistors while Al two-layered wiring structure has thus far been accomplished in memory LSIs of a mega-bit (Mbit) class.

Problems which must be solved for realizing a multi-layered wiring structure include, among other things, making the inter-level insulator film(s) flat and also in making reliable the inter-level connection hole(s) (through-hole). Bias sputter technique and SOG (Spin On Glass) technique have been employed to solve the former while an embedding technique of W (tungsten) by selective CVD (chemical vapor deposition) has been used to cope with the latter.

In a semiconductor integrated circuit having a multi-layered wiring structure, a problem which has been of concern (Japanese Patent Laid-Open No. 119749) is that the achieved final dimension of wirings, particularly the wiring width, exhibits a difference between a region of the same wiring layer where the wiring density is high and a region where the wiring density is low because of the proximity effect of a resist film at the time of patterning of the wiring and because of the difference of etching rates when the Al film is etched. To solve this problem, according to the technique employed by the Japanese Patent Laid-Open No. 119749/1985 described above, the wiring density of the same wiring layer is made uniform by disposing a dummy pedestal, which does not function as part of the wiring itself, in a region having a low wiring density.

On the other hand, in logic LSIs such as a gate array and a micro-computer, the number of terminals (input-/output pins) for the connection with external circuits has drastically increased in direct relation with the improvements in the multi-functions made and in the higher integration density of the integrated circuit achieved. A wire bonding system, however, which is employed for establishing the connection with the external circuits by connecting the wires to bonding pads disposed at the peripheral portions of the semiconductor chip has substantially reached its limit. Moreover, since problems associated with such a wire bonding system result from the wiring length becoming increased because the wirings of the internal regions are extended to the corresponding bonding pads at the peripheral portions which, furthermore, results in the signal transmission speed being reduced and, therefore, signal transfer being delayed, the system would not be suitable as a packaging system of the logic LSIs for which a high operation speed is required.

For the reasons described above, a so-called "flip-chip system" which connects bumps (salient electrodes) comprised of a solder or the like to the uppermost wiring of the integrated circuit and mounts the chip to a substrate through this bump has drawn increased attention. In accordance with the flip-chip system, the terminals can be disposed not only at the peripheral portions of the chip but also at its internal regions, and the system provides the advantage that the number of pins of the chip can be increased. The flip-chip system is a packaging system suitable for logic LSIs which must operate at a high operation speed because the wiring length can be substantially less than that required by the wire bonding system.

The flip-chip system is described in detail, for example, in "IBM Journal of Research and Development," Vol. 13, No. 3, pp. 239-250. According to this literature, the connection of the solder bump to the wiring of the uppermost layer is conducted in the following way.

First of all, contact holes reaching the Al wiring of the uppermost layer are bored by etching a passivation film, which film is provided for protecting the surface of the chip, and electrode pads are formed. Next, a solder base layer (BLM: Bump Limiting Metallurgy) is formed by laminating sequentially thin films of Cr (chromium), Cu (copper) and Au (gold) on the electrode pad by vacuum deposition in such a manner as to cover the bottom, sidewalls and upper edge of the contact hole. Chromium (Cr), as the lowermost layer of the solder base layer, is disposed as a film which prevents the alloy reaction between the solder bump and the Al electrode pad and determines the outer diameter of the solder bump. Copper (Cu), constituting the intermediate layer of the solder base layer, is disposed in order to improve wettability of the solder bump and to improve the bonding strength with the base layer. Gold (Au), constituting the uppermost layer of the solder base layer, is disposed to prevent corrosion of the Cu layer below it during the machining process of the BLM layer.

Next, a solder film made of a tin (Sn)/lead (Pb) alloy is selectively deposited onto the solder base layer described above and is wetted back inside a reflow furnace to form hemispherical solder bumps.

SUMMARY OF THE INVENTION

The inventors of the present invention have determined that the following problems occur when the solder bumps are formed on the electrode pads of the semiconductor integrated circuit device having a multi-layered wiring structure such as an Al four-layered wiring structure.

When wirings are turned into a multi-layered structure, the step or level gradation, including a crevice, of the solder base layer increases in accordance with the cumulative number of vertically superpositioned (stacked) layers of wirings and that flatness of the wiring of the uppermost layer and that of the passivation film on the former drops. In the case of a logic LSI consisting of bipolar transistors, in particular, the film thickness of wiring is great in order to reduce the wiring delay and to improve resistance to electromigration, and, furthermore, the drop in flatness of the uppermost layer wiring and in the passivation film is substantial.

If flatness of the uppermost layer wiring and that of the passivation film drops, i.e. flatness is reduced, reliability of the solder bump connection likewise drops, i.e. reliability is significantly reduced, for the following reasons. If flatness of the uppermost layer wiring drops, flatness of the electrode pad also drops so that the coverage (step covering property) of the solder base layer formed on the electrode pad drops, also. If the coverage of Cr constituting the lowermost layer of the solder base layer drops, an alloy reaction would occur between the solder bump and the Al electrode pad which would result in the connection resistance increasing. If the coverage of Cu constituting the intermediate layer of solder base layer drops, wettability of this intermediate layer would also drop which would reduce the bonding strength of the solder bump with the base layer. If the coverage of Au constituting the uppermost layer of the solder base layer drops, the Cu of the lower layer would more likely become corroded, which would result in an increase in the connection resistance and in a corresponding drop of the bonding strength. If flatness of the passivation film drops, the following problem develops. Namely, when a solder bump 51 is formed at a location above positions bridging two adjacent uppermost layer wirings, such as, 50, 50 as shown in FIG. 10, for example, the coverage of the solder base layer 53 drops at the step or crevice A associated with the passivation film 52 and wherein defects 54 such as voids and cracks occur in the solder bump 51 on the step A. Accordingly, heat resistance of the solder bump 51 increases, the bonding strength drops and, of course, reliability is reduced.

It is therefore an object of the present invention to provide a technique capable of improving connection reliability of solder bumps.

It is another object of the present invention to provide a technique capable of accomplishing the object described above in conjunction with a multi-layered structure of a semiconductor integrated circuit It is still another object of the present invention to provide a technique capable of accomplishing the objects described above in conjunction with a multi-pin structure of a semiconductor chip.

The above and other objects and novel features of the present invention will become more apparent from the following description of the specification in view of the accompanying drawings exemplifying the present invention which is defined in the appended claims.

As to the invention disclosed in this application, a brief description of the improved aspects follows.

In a semiconductor integrated circuit device equipped with a plurality of wiring layers insulated from one another by insulator films and with solder bumps connected to the wiring of the uppermost layer, one aspect of the present invention disposes dummy patterns of unused wirings in a region positioned substantially below the solder bumps in a remaining or unused region of the wiring layer below the uppermost wiring layer.

According to the technique described above, the wiring density (inclusive of the dummy pattern) of the region in which the dummy pattern is disposed becomes high so that the entire surface of an inter-level insulator film formed on the upper layer wiring is made flat. In other words, no step or level gradation develops on the base of the uppermost wiring layer in the region positioned substantially below the solder bump and a flat electrode pad can therefore, be formed. As a result, coverage of the solder base layer formed on the electrode pad can be improved and connection reliability of the solder bump can be improved, also.

DESCRIPTION OF PREFERRED EMBODIMENTS

Embodiment 1

The semiconductor integrated circuit device of this Embodiment 1 is an ECL (Emitter Coupled Logic) gate array having an Al four-layered wiring structure, for example.

Figure 1:
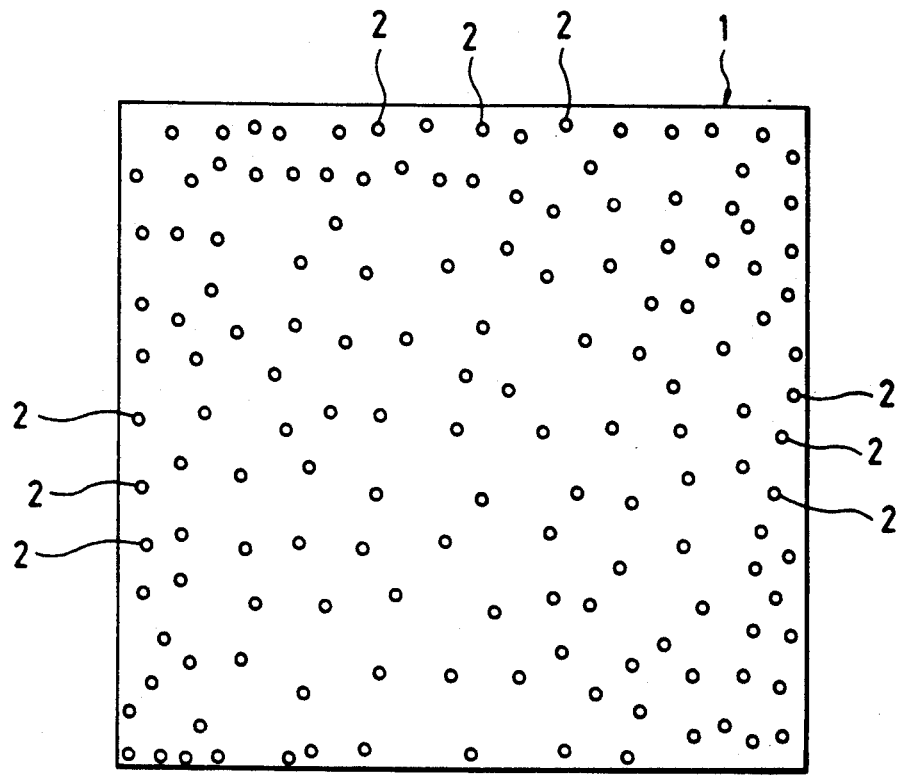
FIG. 1 is a plan view of a semiconductor chip showing the layout of a solder bump.

FIG. 1 shows a semiconductor chip 1 on which this ECL gate array is formed. The chip 1 is made of a p⁻ type single crystal silicon, for example. A large number of solder bumps 2, which constitute the terminals for connection with external circuits, are formed on substantially the entire surface of the chip 1. The solder bumps 2 consists of solder bumps 2 for supplying power sources ($V_{EE}$, $V_{TT}$, $V_{CC}$, etc.) to the internal circuits of the ECL gate array and solder bumps 2 for signals, such as, for the inputting of and outputting of signals.

Figure 2:
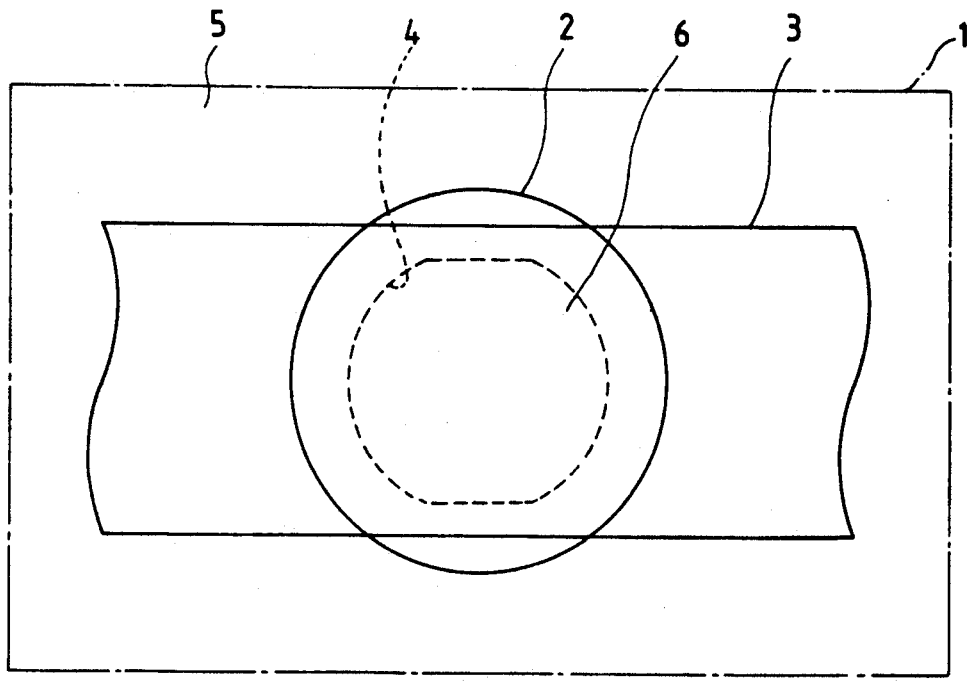
FIG. 2 is an enlarged plan view of the principal portions of a semiconductor chip showing a solder bump.

FIG. 2 shows an enlarged plan view of one power source supply solder bump 2 and a fourth layer Al wiring 3 below the former. The fourth layer Al wiring 3 constitutes the power source wiring for supplying the power source to the internal circuits of the ECL gate array and its line width is from several dozen microns to that of several hundred microns. The solder bump 2 and the fourth layer Al wiring 3 are connected electrically to each other through a contact hole 4. The contact hole 4 is formed by etching a passivation film 5 which film is for protecting the surface of the chip 1. The solder bump 2 is formed on the fourth layer Al wiring 3 exposed at the bottom of the contact hole 4, that is, on an electrode pad 6. On the other hand, the solder bump 2 for the inputting (outputting) of a signal is also formed on the electrode pad on the fourth layer Al wiring 5 which wiring constitutes the signal wiring of the ECL gate array.

Figure 3:
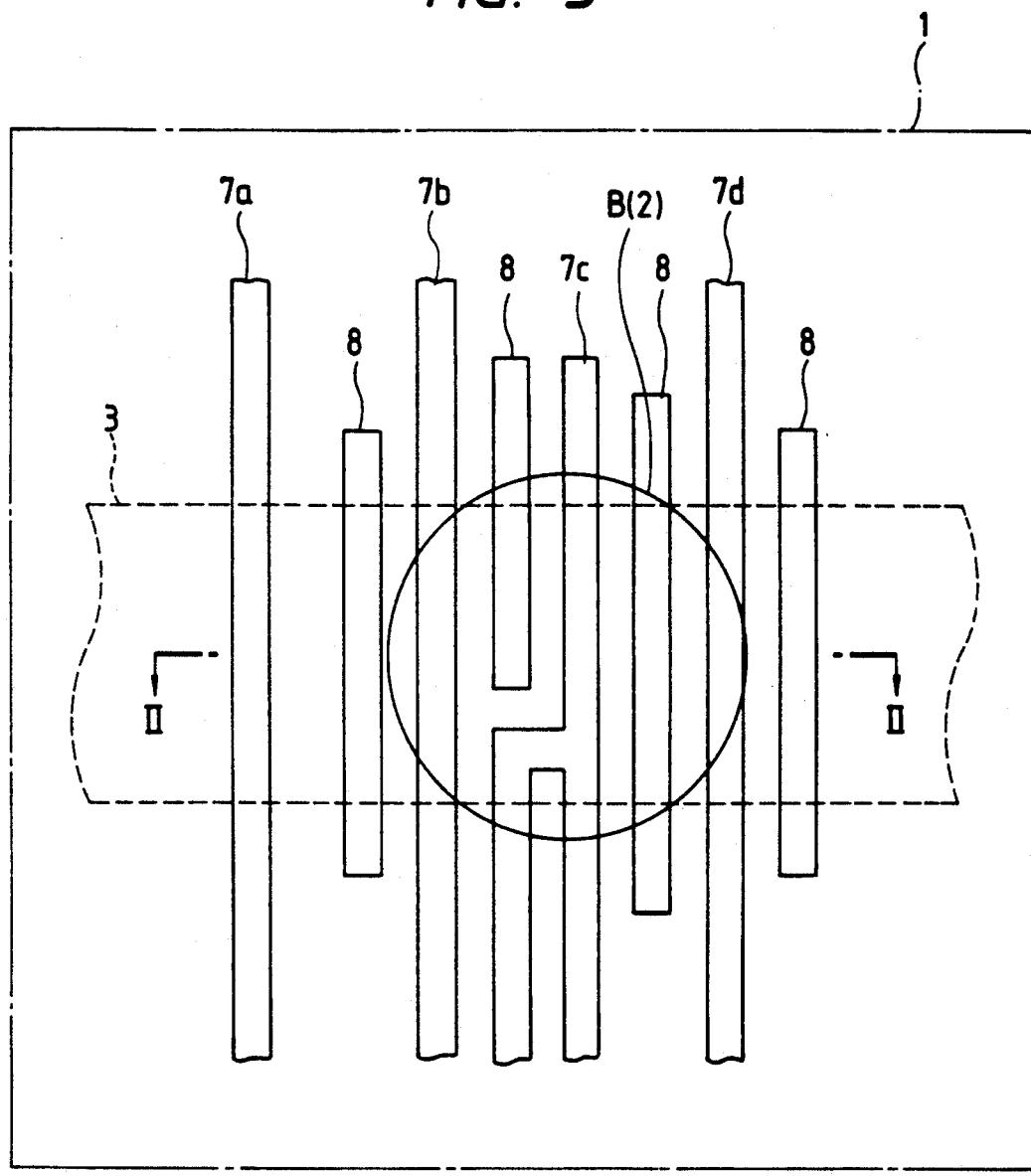
FIG. 3 is a plan view of the principal portions of the semiconductor chip showing the arrangement of a dummy pattern in a semiconductor integrated circuit device in accordance with one embodiment of the present invention.

FIG. 3 shows the layout of the wirings in a region below the power source supply solder bump 2. The solder bump 2 is disposed in the region B encircled by a solid line in the drawing and the fourth layer Al wiring 3 described above extends to the right and left, i.e. along a horizontal direction and parallel to the sectional view line II—II, below this region B. Third layer Al wirings 7a–7d, which have predetermined gaps or spacings between them, extend in the vertical direction of the drawing, which is perpendicular to the direction of the fourth layer Al wiring 3, and are formed below the fourth layer Al wiring 3. The third layer Al wirings 7a–7d constitute the signal wirings of the ECL gate array and their width is several microns, for example. An inter-level insulator film 29, not shown in FIG. 3, is disposed between the fourth layer Al wiring 3 and the third layer Al wirings 7a–7d.

Dummy patterns 8, made of the same material as that of the third layer Al wirings 7a–7d and having substantially the same line width, are disposed below the solder bump 2 in the remaining region of the same wiring layers as the third layer Al wirings 7a–7d and have similar predetermined gaps or spacings between them. These dummy patterns of unused wirings 8 are formed on wiring channels, on which the wirings are not formed, among the wiring channels of the third layer Al wirings. The dummy pattern 8 is a conduction film which is at the same layer level as and is formed by the same fabrication step and by use of the same mask as with respect to the third layer Al wirings 7a–7d, for example.

The dummy pattern 8 which is not being utilized as is the remainder of the third layer Al wiring is made of the same material (i.e. conductor film) as the third layer Al wirings 7a–7d but remains inoperative and is in a floating state condition. Therefore, it does not have the function of wiring These dummy wiring patterns 8 are disposed in only the region below the solder bump 2 and in the proximity of the former Accordingly, the increase in a parasitic capacitance of the third layer Al wirings 7a–7d due to the disposition of the dummy patterns 8 is minimized.

Figure 4:
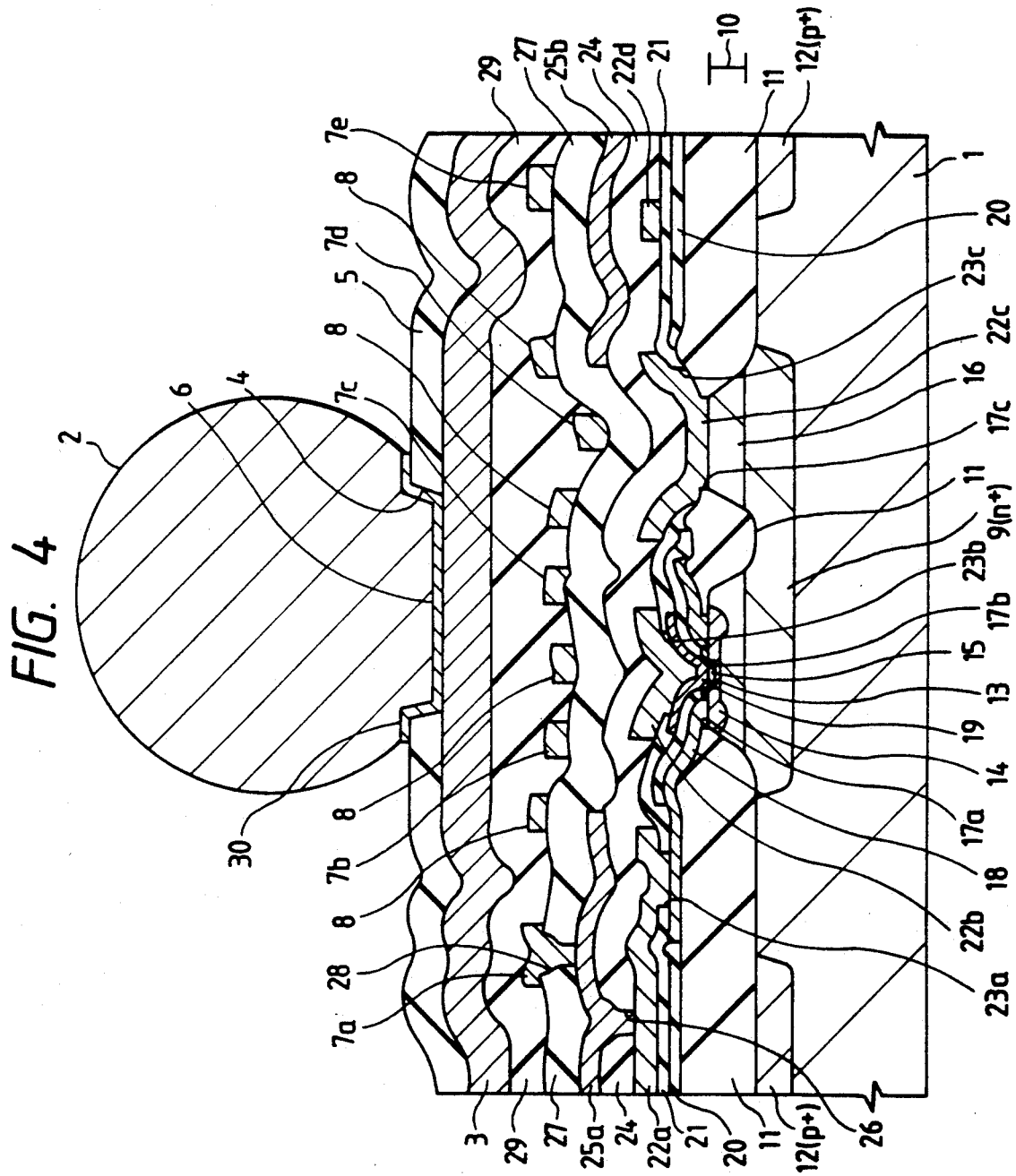
FIG. 4 is a sectional view of the semiconductor chip taken along line II—II in FIG. 3.

FIG. 4 shows the section of the chip 1 in a region below the power source supply solder bump 2 described above. An n+ type collector embedded layer (buried layer) 9, for example, is formed on the main plane (upper surface) of the chip 1 and an epitaxial layer 10 made of n type silicon, for example, is formed on the former A field insulator film 11 made of silicon dioxide (SiO$_2$), for example, is formed in a predetermined region of the epitaxial layer 10 so as to isolate the devices and the internal regions of each device. A p+ type channel stopper layer 12, for example, is formed below the field insulator film 11 for providing device isolation.

Figure 5:
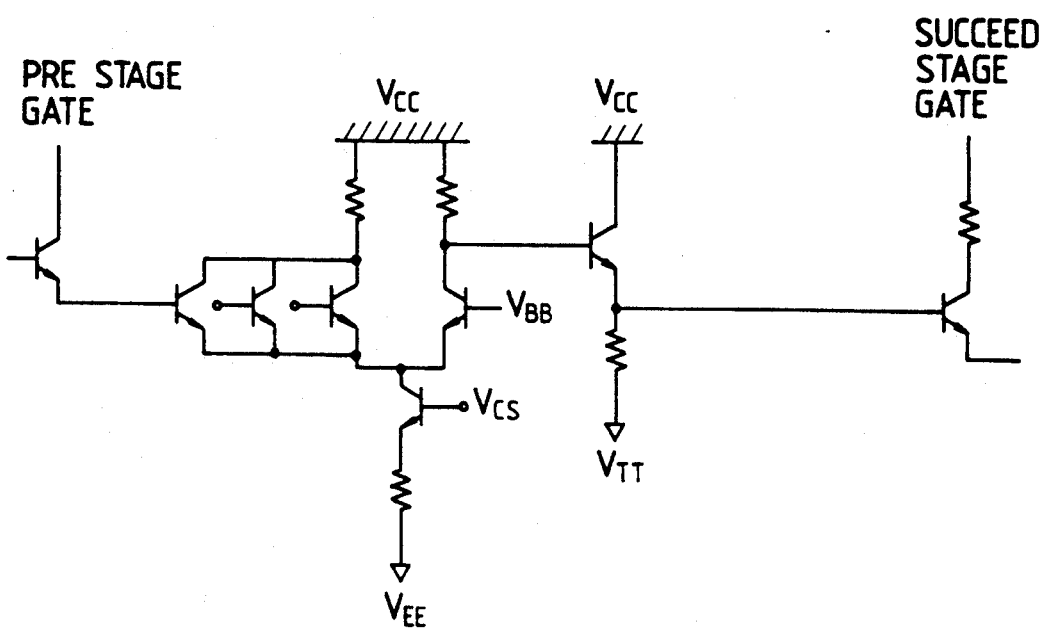
FIG. 5 is a circuit diagram showing an ECL 3-input OR gate.

A p type intrinsic base region 13 and a p+ type graft base region 14, for example, are formed in the epitaxial layer 10 encompassed by the field insulator film 11 and an n+ type emitter region 15, for example, is formed inside this intrinsic base region 13. An n+ type collector pick-up (lead-out) region 16, for example, is connected to part of the collector embedded layer 9. One n-p-n type bipolar transistor consists of the emitter region 15, the intrinsic base region 13 and the collector region that consists of the epitaxial layer 10 and the collector embedded layer (buried layer) 9 below the intrinsic base region 13. A basic gate such as an ECL 3-input OR gate shown in FIG. 5, for example, is constituted by a plurality of such n-p-n bipolar transistors and corresponding resistors, not shown in the drawing, and the ECL gate array is constituted by integrating a large number of these basic gates.

Contact holes 17a, 17b and 17c are disposed on the graft base region 14, the emitter region 15 and the collector pick-up (lead-out) region 16, respectively. A base pick-up electrode 18 made of polycrystalline silicon (poly-silicon), for example, is connected to the graft base region 14 through the contact hole 17a. An emitter pick-up electrode 19 made of polysilicon, for example, is connected to the emitter region 15 through the contact hole 17b.

Reference numerals 20 and 21 represent insulator films made of SiO$_2$, for example. First layer Al wirings 22a–22d are formed on the insulator film 21. Each of these Al wirings 22a–22d has a laminate structure wherein a barrier metal such as TiN (titanium nitride) is laminated on the lower layer of an Al—Si—Cu alloy, for example, and its line width is several microns, for example, the Al wiring 22a is connected to the base pick-up electrode 18 through a through-hole 23a bored on the insulator film 21. The Al wiring 22b is connected to the emitter pick-up electrode 19 through a through-hole 23b. The Al wiring 22c is connected to the collector pick-up (lead-out) region 16 through the through-hole 23c and through the contact hole 17c, described above. In other words, the Al wirings 22a, 22b and 22c constitute the base, emitter and collector electrodes of the n-p-n bipolar transistor described above, respectively A first inter-level insulator film 24 obtained by laminating an Si$_3$N$_4$ film formed by plasma-CVD, for example, and SiO$_2$ formed by SOG (Spin On Glass) and plasma-CVD is formed on the first layer Al wirings 22a–22d. Second layer Al wirings 25a, 25b made of an Al—Si—Cu alloy, for example, are disposed on the inter-level insulator film 24. The Al wirings 25a, 25b have a line width of several microns, for example. The Al wiring 25a, for example is connected to the first layer Al wiring 22a through a through-hole 26 bored in the inter-level insulator film 24.

A second inter-level insulator film 27 having the same structure as the first inter-level insulator film 24 is disposed on the second layer Al wirings 25a–25b. Third layer Al wirings 7a–7e made of an Al—Si—C alloy, for example, are disposed on the inter-level insulator film 27. The Al wiring 7a, for example, is connected to the second layer Al wiring 25a through a through-hole 28 bored in the inter-level insulator film 27.

The plurality of dummy wiring patterns 8, previously described, are disposed in the region below the solder bump 2 and in the proximity thereof in the available remaining region of the same wiring layer which is used for forming the third layer Al wirings 7a–7e. The dummy wiring patterns 8 are disposed alternately and equidistantly with the third layer Al wirings 7b, 7c, 7d positioned below the solder bump 2 and in the proximity thereof, for example. As a result, in the region below the solder bump 2 and in the proximity thereof, the wirings (inclusive of the dummy patterns) are disposed at a relatively higher density and are more uniform in comparison with the other regions of the same wiring layer.

A third inter-level insulator film 29 having the same structure as the first and second inter-level insulator films 24, 27 is formed on the third layer Al wirings 7a–7e and on the dummy wiring patterns 8. The wirings inclusive of the dummy patterns 8 are disposed at a high density and are more uniform in the region below the solder bump 2 and in the proximity thereof, and, as a result thereof, the surface of this insulator film 29 which is below the solder bump 2 and in the proximity thereof is made substantially flat throughout.

The fourth layer Al wiring 3 for supplying the power source, made of an Al—Si—Cu alloy, for example, is disposed on the inter-level insulator film 29. This fourth layer Al wiring 3 has a greater width and thickness than those of the Al wirings of the lower layers (the first to third layers) so that a large current can flow therethrough. Since the surface of the third inter-level insulator film 29, as the base of the fourth layer Al wiring 3, is substantially flattened throughout the region below the solder bump 2 and in the proximity thereof, the surface of the fourth layer Al wiring 3 which is below the solder bump 2 and in the proximity thereof, as a result, becomes substantially flattened throughout, also.

The passivation film 5 made of SiO₂ formed by bias sputtering, for example, is disposed on the fourth layer Al wiring 3 and protects the surface of the chip 1. The contact hole 4 is formed through a part of the passivation film 5 so as to expose an upper surface at a part of the fourth layer Al wiring 3 which part has formed thereon an electrode pad 6. For the reasons which have been described already, the surface of the electrode pad 6 is also substantially flattened throughout.

A thin solder base layer 30 formed by laminating thin films of Cr, Cu and Au in the order named from the lower layers, for example, by vacuum deposition is formed on the electrode pad 6. Since the solder base layer 30 is formed on the flat electrode pad 6 having no step or level gradations thereat, its coverage is extremely good wherein it covers completely the bottom, sidewalls and upper edge of the contact hole 4 with a substantially uniform thickness.

The hemi-spherical solder bump 2 made of an Sn/Pb alloy, for example, is connected onto the solder base layer 30. The solder bump 2 is produced, for example, by the steps of depositing a photoresist on the entire surface of the chip 1, removing the photoresist on the contact hole 4 by etching, then vacuum depositing a solder on the entire surface of the chip 1, removing simultaneously the photoresist and the solder on the surface of the former by etching-back and thereafter wetting back the solder remaining inside the contact hole 4 inside a reflow furnace. Since the solder bump 2 is formed on the solder base layer 30 having extremely excellent coverage, its connection reliability is extremely high.

Figure 6:
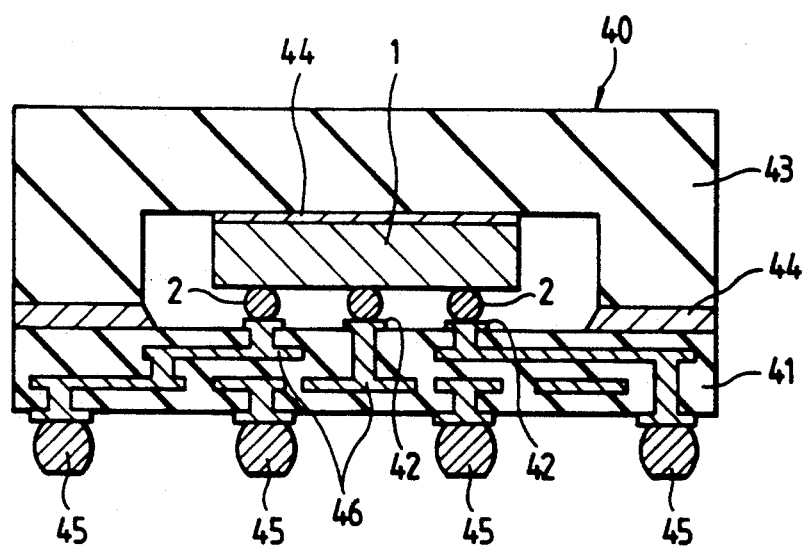
FIG. 6 is a sectional view of a micro-chip carrier sealing the semiconductor chip.

The chip 1 having the construction described above is mounted to the substrate through the solder bumps 2. FIG. 6 shows a micro-chip carrier (MCC) 40 onto which chip 1 is mounted, for example. The chip 1 which is subjected to face-down bonding onto the electrodes 42 of a mullite substrate 41 through the solder bumps 2 is sealed hermetically by a cap 43 made of aluminum nitride (AlN), for example, the cap 43 is bonded onto the mullite substrate 41 through the solder 44. The lower surface of the cap 43 and the upper surface of the chip 1 are bonded to each other through the solder 44 and the heat generated from the chip 1 is radiated outward through the cap 43. Solder bumps 45 that are a size greater than the solder bumps 2 are bonded to the lower surface of the mullite substrate 41. The solder bumps 45 are electrically connected to the chip 1 through internal wirings 46 made of W (tungsten), for example.

The Embodiment 1 having the construction described above provides the following effects.

(1) The dummy wiring patterns 8 are disposed in the remaining region of the same wiring layer as the third layer Al wirings 7a–7e below the solder bumps 2 and in the proximity thereof. Therefore, the wiring density (inclusive of the dummy patterns) becomes higher in this region and in each such region on the chip and since the surface of the inter-level insulator film 29 formed on it becomes flat, the fourth layer Al wiring 3 (the electrode pad 6) formed on the inter-level insulator film 29 is flattened. As a result, coverage of the solder base layer 30 formed on the electrode pad 6 becomes excellent and connection reliability of the solder bump 2 can be improved.

(2) As a result of (1), described above, connection reliability can be improved when the chip 1 is subjected to face-down bonding onto the mullite substrate 41 of the microchip carrier 40 through the solder bumps 2.

(3) As a result of (1), the multi-layer structure of the ECL gate array can thus be implemented.

(4) Also as a result of (1), the multi-pin structure of the ECL gate array can be implemented.

Embodiment 2

The semiconductor integrated circuit device of this Embodiment 2 relates to an ECL gate array having an Al four-layered wiring structure in the same way as in Embodiment 1.

Figure 7:
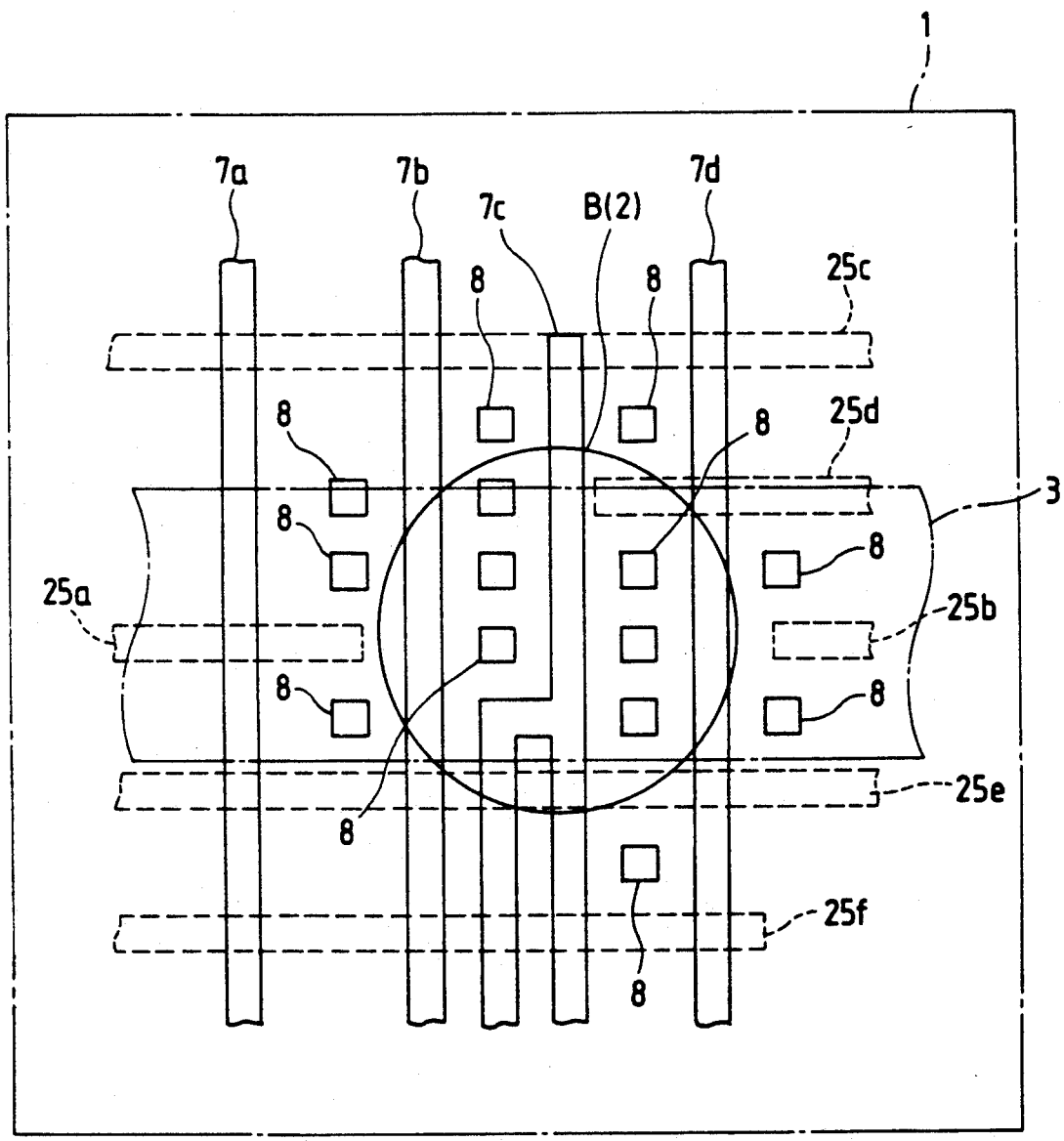
FIG. 7 is a plan view of the principal portions of the semiconductor chip showing the arrangement of the dummy pattern in a semiconductor integrated circuit device in another embodiment of the present invention.

FIG. 7 shows one power source supply solder bump 2 and the layout of wirings in the region below the bump 2. The solder bump 2 is disposed in the region encompassed by a solid line in the drawing and the fourth Al wiring 3 for the supply of the power source, disposed as the uppermost layer wiring, extends to the right and left below the region B. The signal input/output third layer Al wirings 7a–7d extend below the fourth layer Al wiring 3 in the vertical direction of the drawing and have predetermined gaps or spacings between them. In the same way as in Embodiment 1, the fourth layer Al wiring 3 has a line width ranging from several dozen microns to several hundred microns and the third layer Al wirings 7a–7d have a line width of several microns, for example.

The second layer Al wirings 25a–25f for the signal input/output extend below the third layer Al wirings 7a–7d to the right and left in the drawing and have predetermined gaps between them. The second layer Al wirings 25a–25f have a line width of several microns, for example, in the same way as the third layer Al wirings 7a–7d.

Rectangular dummy wiring patterns 8 made of the same material as that of the third layer Al wirings 7a–7d, for example, are disposed in the remaining region of the same wiring layer as the third layer Al wirings 7a–7d in the region below the solder bump 2 and in the proximity thereof and have predetermined gaps or spacings between them. These dummy wiring patterns 8 are disposed in a mesh form or mesh-like arrangement in the region below the solder bump 2 and in the proximity thereof where the remaining region which is the same layer as the third layer Al wirings 7a-7d overlaps with the remaining region which is the same layer as the second layer Al wirings 25a-25f. In other words, the dummy wiring patterns 8 which may be square-shaped are disposed below the solder bump 2 and in the proximity thereof on the region where the wiring channels of the same layer (the third layer) cross the wiring channels of the wiring layer (the second layer) immediately therebelow. The dummy wiring patterns 8 are formed by the same fabrication step and by use of the same mask as those of the third layer Al wirings 7a-7d, for example. The ECL gate array of this Embodiment 2 has the same structure as that of the ECL gate array of Embodiment 1 except for the structure described above. Therefore, the description of the same structural portion will be omitted.

As described above, the dummy wiring patterns 8 of Embodiment 2 are disposed in only the region below the solder bump 2 and in the proximity thereof and, moreover, in the region having no wirings immediately therebelow. Accordingly, its occupying area is smaller than that of the dummy pattern of Embodiment 1. For this reason, the parasitic capacitance of the third layer Al wirings 7a-7d, which increases when the dummy wiring patterns 8 are disposed, can be reduced even more so than in Embodiment 1.

Incidentally, the gate array is an LSI of a system wherein the wirings are laid out in accordance with the kind of gate array on a master slice on which devices such as transistors and resistors are in advance formed. If the dummy patterns 8 are to be laid out on the wiring channels, where no wiring exists, among the wiring channels of the third layer Al wirings such as in the case of Embodiment 1, the dummy patterns 8 must be laid out in accordance with the wiring layout required by the corresponding gate array. This results in the problem in that the development period of the gate array becomes undesirably extended. In Embodiment 2, however, the dummy patterns 8 are laid out in accordance with fixed patterns on the region where the wiring channels of the third layer Al wirings cross the wiring channels of the second layer Al wirings. In this manner, a particular arrangement is not necessary for generating the dummy wiring patterns 8 at the time of the layout design of the wirings and therefore the development period of the gate array does not become undesirably extended.

Embodiment 3

The semiconductor integrated circuit device of this Embodiment 3 relates to the structure wherein an inclination is formed on the sidewall of the fourth layer Al wiring 3 in the ECL gate array of Embodiment 1 or 2.

Figure 8:
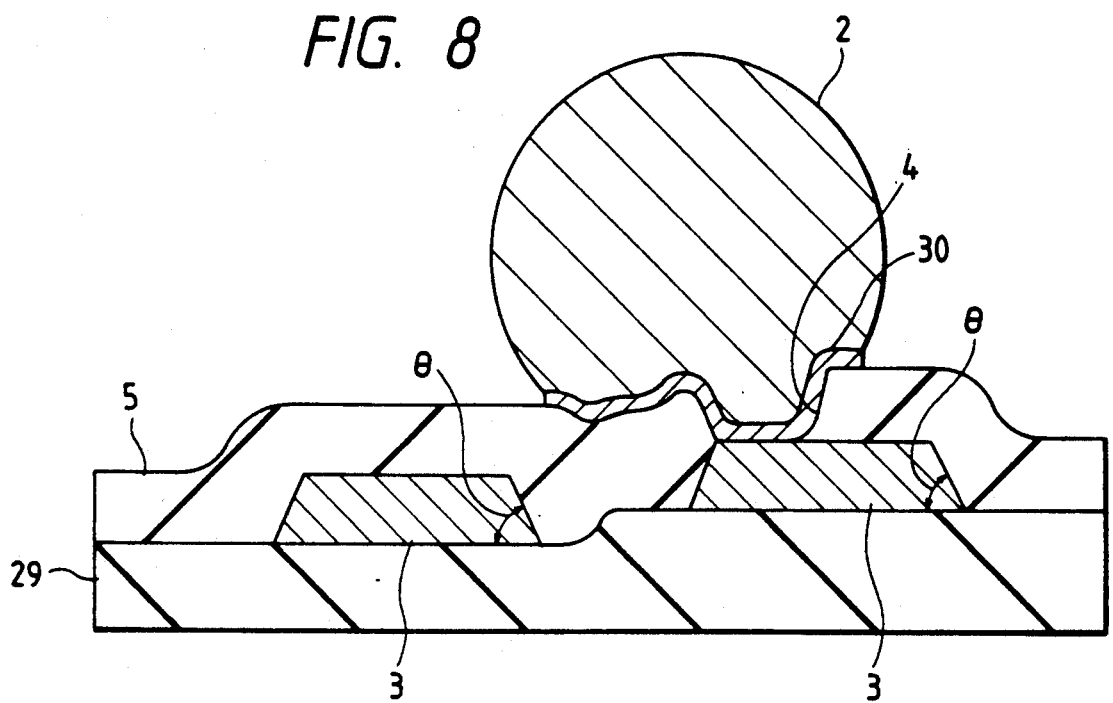
FIG. 8 is an enlarged partial sectional view of the semiconductor chip showing the step of the passivation film.
Figure 10:
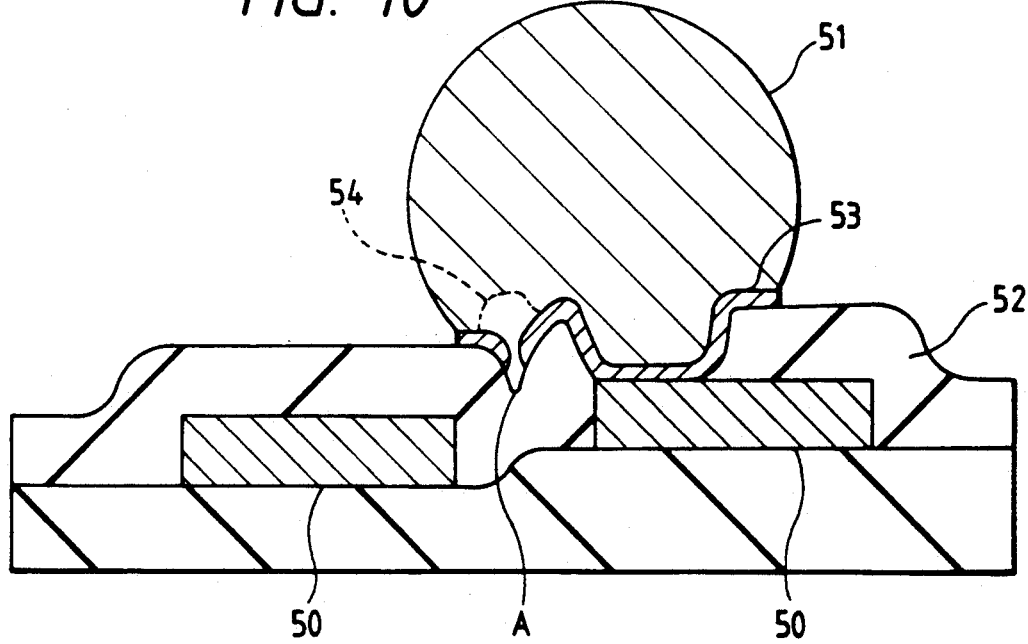
FIG. 10 is an enlarged partial sectional view of the semiconductor chip showing the step of the passivation film in a conventional semiconductor integrated circuit device.

As shown in FIG. 8, it often occurs in a gate array, depending on the particular kind, wherein the solder bump 2 is not disposed immediately above the fourth layer Al wiring 3 but rather is disposed at a position bridging two adjacent Al wirings 3, 3. As to the individual line widths and gap or spacing therebetween of the fourth layer Al wirings 3, they vary depending on the type of gate array implemented; the positions, however, of the solder bumps 2 on the chip 1 remain fixed. In such a case, coverage of the solder base layer 30 cannot always be improved by merely disposing the dummy patterns 8 in the regions below the solder bumps 2. If any step or level gradation occurs between the adjacent two uppermost layer wirings 50 and 50, as has already been explained, with reference to FIG. 10, coverage of the solder base layer 53 drops at the step or crevice A of the passivation film 52 so that defects 54, such as voids and cracks, would likely occur in the solder bump 51 above this step A which would result in a significant reduction in connection reliability of the solder bump 51.

In this Embodiment 3, therefore, an inclination or level is formed on the sidewall of the fourth layer Al wiring 3 which is the uppermost layer wiring, as shown in FIG. 8. Since this arrangement improves coverage of the passivation film 5 formed on the fourth layer Al wiring 3, a flat passivation film 5 free from any such undesired step can be obtained. Therefore, even when any step or level gradation develops between the two adjacent Al wirings 3 and 3, coverage of the solder base layer 30 becomes excellent and the occurrence of defects such as voids and cracks in the solder bump 51 can thereby be prevented. Thus, connection reliability of the solder bump 2 can be improved.

This inclination can be formed on the sidewall of the fourth layer Al wiring 3 by isotropic etching such as wet etching when the Al wirings 3 are patterned In this instance, the angle of inclination $\theta$ of the inclination is preferably from 50° to 70°. The ECL gate array of this Embodiment 3 has the same structure as those of Embodiments 1 and 2 except for the structure described above. Accordingly, the explanation of the same constituent will be omitted.

The formation of the inclination on the sidewall of the fourth layer Al wiring 3 provides further the following effect.

When the solder bump is bonded onto the electrode pad, it has been a customary practice to form a passivation film by bias sputtering since better coverage results from bias sputtering than from a passivation film formed by CVD. However, since bias sputtering is a kind of film formation technique wherein deposition of thin films and etching proceed simultaneously, it has the drawback in that the film formation speed is lower than in CVD.

In embodiment 3, however, since the inclination is formed on the sidewall of the fourth layer Al wiring 3, good coverage can be obtained, also, even when the passivation film 5 is formed by CVD. In other words, when the inclination is formed on the sidewall of the fourth layer Al wiring 3, the passivation film 5 can be formed at a high speed since good film coverage can be provided by employing CVD which is a high speed film formation technique so that the improvement in both the connection reliability of the solder bump 2 and in the shortening of the time required for the film formation step of the passivation film 5 can be accomplished simultaneously.

Although the present invention has thus been described specifically with reference to exemplified Embodiments 1 to 3 in conjunction with the related illustrations, the invention is not to be considered as being particularly limited thereto and that obvious changes and modifications can be implemented without departing from the spirit and scope thereof but only limited by the scope of the appended claims.

Figure 9:
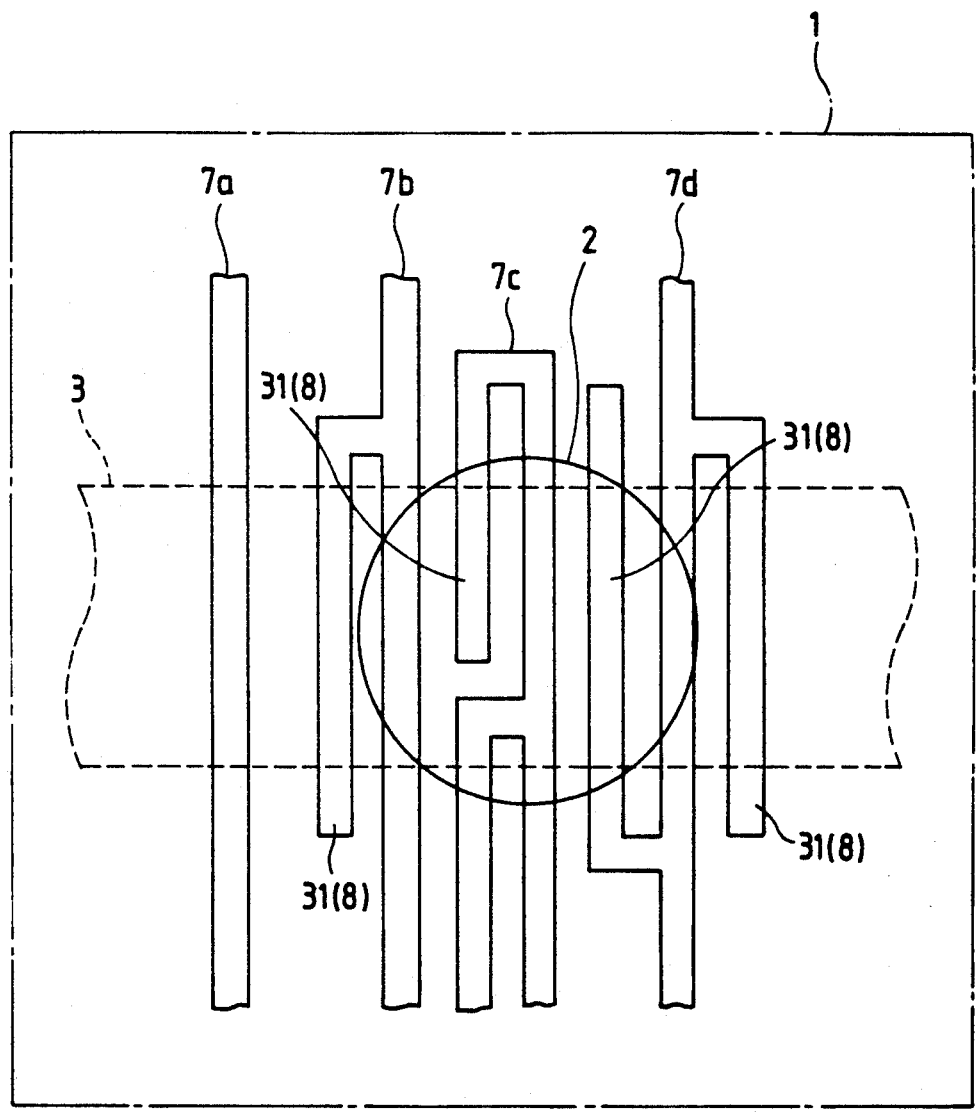
FIG. 9 is a plan view of the principal portions of the semiconductor chip showing the arrangement of the dummy pattern in a semiconductor integrated circuit device in still another embodiment of the present invention.

The dummy patterns in Embodiments 1 through 3 remain in the floating state and do not have the function of active wirings. However, the dummy patterns 8 may be constituted by branches 31 by forming such a branch 31 at part of each third layer Al wiring 7b-7d in the region below the solder bump 2 as shown in FIG. 9, for example.

Though the dummy patterns of Embodiments 1 through 3 are disposed in the remaining region of the same layer as the third layer Al wirings, they may be disposed instead in the remaining region of the same layer as the second layer Al wiring. The dummy patterns may, furthermore, be disposed in each of a plurality of wiring layers.

Although the present invention which has been implemented by the present inventors has thus been described primarily with reference to the ECL gate array having the four-layered wiring structure as discussed previously, the present invention is not particularly limited thereto but can be applied in general to flip-chip system semiconductor integrated circuit devices which are equipped with a multi-layered wiring structure.

The effects brought forth by the typical invention among those embodiments disclosed herein are briefly as follows.

(1) The dummy patterns are disposed in the region positioned substantially below the solder bumps and in the proximity thereof among the remaining regions of the wiring layer below the uppermost wiring layer to which the solder bumps are bonded. Since the uppermost layer wiring in the region below the solder bumps can be substantially flattened in this manner, coverage of the solder base layer formed on the electrode pads becomes excellent and connection reliability of the solder bumps can be improved.

(2) The increase in the parasitic capacitance of wirings resulting from the disposition of the dummy patterns can be minimized by disposing the dummy patterns in the mesh form on the regions where the wiring channels of the same layer and the wiring channels of the wiring layer immediately below the former cross one another. Since no specific treatment or arrangement for generating the dummy patterns is necessary at the time of layout design of wirings, the development period of the gate array can be shortened.

(3) Coverage of the passivation film can be improved and its surface flatness can be improved, too, by disposing the sidewall of the upper layer wiring with an angle of inclination in those situations wherein the solder bump is not disposed immediately above the uppermost layer wiring but is disposed at a position bridging adjacent wirings associated with the uppermost layer. Accordingly, coverage of the solder base layer becomes excellent and the occurrence of defects such as voids and cracks inside the solder bumps can be prevented. Therefore, connection reliability of the solder bumps can be improved.

What is claimed is:

1. A semiconductor integrated circuit device comprising:
   a semiconductor substrate having a plurality of semiconductor devices formed on a main plane;
   a first insulator film formed over said main plane of said semiconductor substrate;
   first wirings formed on said first insulator film and each of said first wirings extending in a first direction;
   a second insulator film formed on said first wirings;
   a second wiring formed on said second insulator film and extending over two adjacent first wirings;
   a third insulator film formed on said second wiring, said third insulator film having a hole so as to expose a surface portion of said second wiring;
   a base layer formed on said exposed surface portion of said second wiring;
   a bump electrode formed on said base layer and electrically connected to said second wiring; and
   a dummy wiring pattern, corresponding to wiring which is to remain electrically unconnected, formed between said two adjacent first wirings and formed under said base layer.

2. A semiconductor integrated circuit device according to claim 1, wherein said dummy wiring pattern is formed at a same formation level as that of said first wirings.

3. A semiconductor integrated circuit device according to claim 2, wherein said dummy wiring pattern extends in said first direction.

4. A semiconductor integrated circuit device according to claim 3, wherein said dummy wiring pattern remains in an electrically floating state condition.

5. A semiconductor integrated circuit device according to claim 4, wherein said dummy wiring pattern is an elongated rectangular pattern longitudinally extending in said first direction.

6. A semiconductor integrated circuit device according to claim 5, wherein said bump electrode comprises a Sn/Pb alloy.

7. A semiconductor integrated circuit device according to claim 6, wherein said base layer comprises a stacked layer of Cr, Cu and Au.

8. A semiconductor integrated circuit device according to claim 4, wherein said dummy wiring pattern is comprises of a straight-line array of substantially square-shaped and evenly spaced wirings.

9. A semiconductor integrated circuit device according to claim 8, wherein said bump electrode comprises a Sn/Pb alloy.

10. A semiconductor integrated circuit device according to claim 9, wherein said base layer comprises a stacked layer 11. A semiconductor integrated circuit device according to claim 2, wherein said dummy wiring pattern is an elongated rectangular pattern longitudinally extending in said first direction.

12. A semiconductor integrated circuit device according to claim 11, wherein said bump electrode comprises a Sn/Pb alloy.

13. A semiconductor integrated circuit device according to claim 12, wherein said base layer comprises a stacked layer of Cr, Cu and Au.

14. A semiconductor integrated circuit device according to claim 2, wherein said dummy wiring pattern is comprises of a straight-line array of substantially square-shaped and evenly spaced wiring.

15. A semiconductor integrated circuit device according to claim 14, wherein said bump electrode comprises a Sn/Pb alloy.

16. A semiconductor integrated circuit device according to claim 15, wherein said base layer comprises a stacked layer of Cr, Cu and Au.

17. A semiconductor integrated circuit device according to claim 5, wherein in a second wiring layer in which said second wiring is formed said second wiring has sidewalls with an angle of inclination with respect to a lower surface of said second wiring layer of 50° to 70°.

18. A semiconductor integrated circuit device according to claim 8, wherein in a second wiring layer in which said second wiring is formed said second wiring has sidewalls with an angle of inclination with respect to a lower surface of said second wiring layer of 50° to 70°.

19. A semiconductor integrated circuit device according to claim 2, wherein in a second wiring layer in which said second wiring is formed said second wiring has sidewalls with an angle of inclination with respect to a lower surface of said second wiring layer of 50° to 70°.

20. A semiconductor integrated circuit device according to claim 2, further comprising third wirings disposed below said first wirings and extending in a second direction substantially perpendicular to said first direction.

21. A semiconductor integrated circuit device according to claim 13, wherein said second wiring extends in a second direction substantially perpendicular to said first direction.

22. A semiconductor integrated circuit device according to claim 21, wherein said dummy wiring pattern remains in an electrically floating state condition.

23. A semiconductor integrated circuit device according to claim 16, wherein said second wiring extends in a second direction substantially perpendicular to said first direction.

24. A semiconductor integrated circuit device according to claim 23, wherein said dummy wiring pattern remains in an electrically floating state condition.

25. A semiconductor integrated circuit device according to claim 3, wherein said second wiring extends in a second direction substantially perpendicular to said first direction.

26. A semiconductor integrated circuit device according to claim 20, wherein said second wiring extends in the second direction.

27. A semiconductor integrated circuit device according to claim 2, wherein said bump electrode comprises a Sn/Pb alloy.

28. A semiconductor integrated circuit device according to claim 27, wherein said base layer comprises a stacked layer of Cr, Cu and Au.

29. A semiconductor integrated circuit device according to claim 2, wherein said base layer comprises a stacked layer of Cr, Cu and Au.

30. A semiconductor integrated circuit device according to claim 1, wherein said third insulator film has a hole to expose said second wiring at a surface portion thereof which overlies a plan view area including a spacing of said two adjacent wirings, and wherein said dummy wiring pattern is formed in the spacing between said two adjacent first wirings and to only cover a plan view area directly underlying said base layer and vicinity thereof.

31. A semiconductor integrated circuit device according to claim 6, wherein said third insulator film has a hole to expose said second wiring at a surface portion thereof which overlies a plan view area including a spacing of said two adjacent wirings, and wherein said dummy wiring pattern is formed in the spacing between said two adjacent first wirings and to only cover a plan view area directly underlying said base layer and vicinity thereof.

32. A semiconductor integrated circuit device according to claim 8, wherein said third insulator film has a hole to expose said second wiring at a surface portion thereof which overlies a plan view area including a spacing of said two adjacent wirings, and wherein said dummy wiring pattern is formed in the spacing between said two adjacent first wirings and to only cover a plan view area directly underlying said base layer and vicinity thereof.

33. A semiconductor integrated circuit device according to claim 22, wherein said third insulator film has a hole to expose said second wiring at a surface portion thereof which overlies a plan view area including a spacing of said two adjacent wirings, and wherein said dummy wiring pattern is formed in the spacing between said two adjacent first wirings and to only cover a plan view area directly underlying said base layer and vicinity thereof.

34. A semiconductor integrated circuit device according to claim 24, wherein said third insulator film has a hole to expose said second wiring at a surface portion thereof which overlies a plan view area including a spacing of said two adjacent wirings, and wherein said dummy wiring pattern is formed in the spacing between said two adjacent first wirings and to only cover a plan view area directly underlying said base layer and vicinity thereof.

* * * * *